United States Patent [19]
Olivarez

[11] Patent Number: 5,381,037
[45] Date of Patent: Jan. 10, 1995

[54] LEAD FRAME WITH SELECTED INNER LEADS COUPLED TO AN INNER FRAME MEMBER FOR AN INTEGRATED CIRCUIT PACKAGE ASSEMBLIES

[75] Inventor: Jerry Olivarez, Milpitas, Calif.

[73] Assignee: Advanced Micro Devices, Inc., Sunnyvale, Calif.

[21] Appl. No.: 71,414

[22] Filed: Jun. 3, 1993

[51] Int. Cl.6 .............. H01L 23/48; H01L 29/44; H01L 29/52; H01L 29/60

[52] U.S. Cl. .................. 257/666; 257/676; 257/678; 257/691; 257/778

[58] Field of Search ............... 257/676, 691, 668, 778, 257/666

[56] References Cited

U.S. PATENT DOCUMENTS

| | | | |
|---|---|---|---|
| 3,748,543 | 7/1973 | Roberson | 257/778 |
| 4,410,905 | 10/1983 | Grabbe | 257/668 |
| 4,899,207 | 2/1990 | Hallowell et al. | 257/676 |
| 5,229,846 | 7/1993 | Kozuka | 257/666 |
| 5,235,207 | 10/1993 | Ohi et al. | 257/675 |

FOREIGN PATENT DOCUMENTS

| | | | |
|---|---|---|---|
| 59-169160 | 9/1984 | Japan | 257/676 |
| 2-253646 | 10/1990 | Japan | 257/676 |

*Primary Examiner*—Andrew J. James
*Assistant Examiner*—S. V. Clark
*Attorney, Agent, or Firm*—Raymond Kwong; Joseph A. Sawyer, Jr.

[57] ABSTRACT

A high performance hermetic integrated circuit package assembly for housing an integrated circuit die wherein the package assembly affords substantially reduced ground bounce within the integrated circuit. The package assembly includes a lead frame of electrically conductive material having a first predetermined pattern of outer leads and a second predetermined pattern of, integrally connected, inner leads for providing interconnection to the die through a plurality of contact pads thereon, a series of electrically conductive wires connecting selected ones of the contact pads to selected ones of the inner leads, a base for mounting the die and includes a first layer of glass for supporting the lead frame and, a cap with a second layer of glass for reacting with the first layer of glass to provide a hermetic enclosure for the die. The lead frame further includes a frame interconnection member at the ends of the outer leads for interconnecting all the outer leads and an inner frame member which includes an annular rectangle of electrically conductive material for interconnecting all inner ground leads for reducing the electrical inductances and resistances of the ground leads and for providing mechanical strength to the lead frame. A carrier ring disposed around the outer leads for providing mechanical stability and testability, and a plurality of spaced tie bar members extending integrally between the inner frame member and the frame interconnection member to allow for multi-stage trimming and forming of the outer leads from the carrier ring.

17 Claims, 8 Drawing Sheets

LEAD FRAME WITH SELECTED INNER LEADS COUPLED TO AN INNER FRAME MEMBER FOR AN INTEGRATED CIRCUIT PACKAGE ASSEMBLIES

FIELD OF THE INVENTION

This invention relates generally to integrated circuit package assemblies and, more particularly, to an improved integrated circuit package assembly that has lower electrical inductances and resistances.

BACKGROUND OF THE INVENTION

As is well known, an integrated circuit is formed on a small, substantially planar, piece of semiconductor, such as silicon, known as a die. The die, in addition to the circuit formed therein, includes contact pads on the top surface at the periphery thereof. The die is enclosed in a package which generally includes a lead frame having a plurality of inner leads and outer leads. Each inner lead is integrally connected to a corresponding outer lead. The outer leads extend externally from the package while the inner leads are internally connected to corresponding contact pads to permit the integrated circuit die to be coupled to the outside world. Before an integrated circuit is ready for use, a frame interconnection member and a dam bar which interconnects all the outer leads has to be trimmed off to singulate each outer lead. The outer leads are then formed to the desired configuration, such as a gull-wing shape, so that the integrated circuit package is ready to be mounted on a printed circuit board (PCB). It is more desirable to perform a multi-stage trim and form operations on the outer leads, that is, the trimming and forming operations are performed sequentially rather than simultaneously. It is known that a sequential operation results in better precision and control of the forming process.

Typically, a plurality of contact pads on the die and a corresponding plurality of leads on the lead frame are reserved for ground connection. Similarly, a plurality of contact pads and a corresponding plurality of leads are reserved for supply voltage connections. Such ground and supply voltage connections are required to permit an operating power supply voltage to be applied to the die.

For less expensive, high volume, integrated circuits, the die has been encapsulated in an insulating housing referred to as a plastic quad flat pack (PQFP) through transfer molding and wherein the die is conductively bonded to a metallic surface called a die paddle. The die paddle is employed to distribute the power supply voltage applied to the power supply leads and die contact pads. The ground connection for the die is established only through the ground leads and contact pads. Such grounding is generally sufficient in integrated circuits that are generally low performance wherein a minimal amount of internal device switching occur in the operation of such integrated circuits.

There are, however, a significant number of high performance hermetic integrated circuits such as microprocessor integrated circuits wherein a high degree of internal device switching occurs. Such high performance hermetic integrated circuits generally require a better ground than the aforementioned PQFP. This results because the device switching in high performance hermetic integrated circuits causes voltage transients which in turn cause what is known as ground bounce wherein the ground voltage is not at zero volts but rather at some finite voltage.

Integrated circuits, such as microprocessor integrated circuits, are generally able to operate properly if the ground bounce is maintained below an acceptable level, such as, for example, 1 volt. When the ground bounce is above the acceptable level, threshold levels of the switching devices can be adversely affected causing the high performance hermetic integrated circuits to operate improperly.

In order to cope with the ground bounce problem in high performance hermetic integrated circuits, such as microprocessor integrated circuits, various measures have been previously taken to maintain the ground bounce below the acceptable limit, of, for example, 1 volt. The main objective is to reduce the inductance of the ground connection. Typically, at least one ground plane is included in the package.

For example, Newman U.S. Pat. No. 5,068,708, assigned to the assignee of the present application, teaches a plastic encapsulated integrated circuit structure comprising a multilayer ground plane assembly bonded to a lead frame with an integrated circuit die bonded to the composite assembly.

However, even though this multilayer ground plane assembly works effectively for its intended purpose, the incorporation of a ground plane increases the cost of the package. Furthermore, plastic encapsulation used in a typical PQFP is non-hermetic and therefore susceptible to penetration of moisture and contaminants from the environment which could lead to earlier failure of the integrated circuit die. On the other hand, a package that provides a hermetic enclosure to the die will be able to avoid such penetration and thus making the package desirable for high reliability requirement, such as in military application.

An integrated circuit packages which is known to provide a hermetic enclosure for the die is referred to as a ceramic quad flat pack, or CERQUAD. There are two types of CERQUAD. The first one is referred to as laminated CERQUAD which is formed from a laminated ceramic base containing the die and encapsulated by a kovar lid sealed to the laminated base using gold-/tin preform. In order to reduce ground bounce in such packages, multiple laminations of ceramic and conductive ground planes are used below the integrated circuit die to sink current and disperse the transient voltages and currents. While such packages are hermetic and are capable of maintaining the ground bounce below the acceptable limits, such as 1 volt, the cost of such packaging has been on the order of ten times the cost of the previously mentioned PQFP without a ground plane.

The other CERQUAD is referred to as a glass-sealed CERQUAD. A glass-sealed CERQUAD comprises a pressed ceramic base where the die is positioned. A glass, typically made from lead-zinc-borated glasses, is used to form a hermetic seal between a pressed ceramic cap and the pressed ceramic base. A lead frame with predetermined patterns of inner lead and integrally connected outer lead is sandwiched between the base and the cap to allow for connection from the die contact pads to the corresponding inner leads, which provide further connection to the outside world through the outer leads. Since a glass-sealed CERQUAD does not require lamination of multilayer ceramic, it is able to provide hermetic enclosure of the integrated circuit die at a substantially lower costs than an equivalent laminated CERQUAD.

A glass-sealed CERQUAD without a ground plane, like a PQFP without a ground plane, is unable to handle high performance hermetic integrated circuits due to ground bounce since the ground connections for the die is likewise established only through the ground leads. Introducing a ground plane to the glass-sealed CERQUAD is possible to reduce the ground bounce below the acceptable limit, of, for example, 1 volt. However, even though the cost of a glass-sealed CERQUAD with a ground plane is substantially lower than that of a laminated CERQUAD, a glass-sealed CERQUAD with ground plane still cost around three times that of one without a ground plane.

Moreover, the PQFP may further be configured into a package known as a "TapePak" structure ("TapePak" is a registered trademark of National Semiconductor Corporation), by having a molded plastic carrier ring that substantially surrounds and is spaced apart from the die encapsulation to support the outer leads for providing mechanical stability and testability. In the "TapePak" structure, a plurality of tie bar members extend integrally from the die paddle to a plurality of frame tab members. Each frame tab members includes at least one positioning holes for positioning. After the outer portion of the frame interconnection member is trimmed off to singulate the outer leads, the encapsulated die paddle remains secured to the molded plastic carrier ring by the tie bar members and the frame tab members. Thereafter, the outer leads can be formed into the desired lead configuration, using the positioning holes on the frame tab members for positioning of the encapsulated die on the forming stage. Thus a preferred multi-stage trim and form operation can be achieved.

In the case of a glass-sealed CERQUAD, no die paddle is available since the die is mounted directly onto the base. Therefore, it is generally not possible to provide tie bar members to allow for multi-stage trim and form operation of the outer leads. Accordingly, the trim and form operation of the outer leads have to be done simultaneously which lead to reduction in precision and control of the forming process. Besides, since the trim and form process is different, a integrated circuit manufacturer who produces PQFP and glass-sealed CERQUAD with the same package outline will have to have two different sets of trim and form tools to accomplish the trim and form process. This is undesirable because it increases manufacturing cost due to extra equipment and factory space.

It would, therefore be desirable to provide an improved, low cost, integrated circuit package having a reduced ground inductances, sufficiently low to maintain the ground bounce within acceptable limit for high performance hermetic integrated circuits, and suitable for use in high reliability applications. Furthermore, it would be desirable to incorporate tie bar members and frame tab members into such a package in the "TapePak" configuration to allow for multi-stage trim and form of the outer leads so that it can use the same trim and form equipment and process set up for a "TapePak" PQFP

SUMMARY OF THE INVENTION

Accordingly, it is a general aspect of the present invention to provide a lead frame with low inductances and resistances on selected leads, for use in a high performance hermetic integrated circuit package.

Another aspect of the present invention is to provide a high performance hermetic integrated circuit package assembly comprising an inner frame member interconnecting selected inner leads for reducing the electrical resistances and inductances of the selected leads.

It is still another aspect of the present invention to provide a high performance hermetic integrated circuit package assembly comprising a lead frame with a predetermined pattern of inner leads and outer leads and an inner frame member interconnecting selected inner leads for reducing the electrical resistances and inductances of the selected leads.

It is still another aspect of the present invention to provide a high performance hermetic integrated circuit package assembly comprising a lead frame with a predetermined pattern of inner leads and outer leads and an inner frame member interconnecting all the ground inner leads for reducing the electrical resistances and inductances of the ground leads, so as to maintain the ground bounce in the package below the acceptable limit.

It is still another aspect of the present invention is to provide a high performance hermetic integrated circuit package assembly comprising a lead frame with a predetermined pattern of inner leads and outer leads, an inner frame member interconnecting all the ground inner leads for reducing the electrical resistances and inductances of the ground leads, tie bar members and frame tab members integrally connected to the inner frame member to allow for multi-stage trim and form of the outer leads so that it can use the same trim and form equipment and process set up for a "TapePak" PQFP.

Additional aspects, advantages, and other novel features of the invention will be set forth in part in the description that follows and in part will become apparent to those skilled in the art upon examination of the following or may be learned with the practice of the invention. The objects and advantages of the invention may be realized and attained by means of the articles and combinations particularly pointed in the appended claims.

In accordance with these aims and aspects, the present invention is concerned with reducing the electrical resistances and inductances on preselected leads in a lead frame used in a high performance hermetic integrated circuit package assembly. The lead frame comprises an inner frame member interconnecting selected inner leads, such as the leads for ground connection, for reducing the electrical resistances and inductances of such leads.

In accordance with another aspect of the invention, a hermetic integrated circuit package assembly for housing a high performance hermetic integrated circuit die is provided. The integrated circuit package assembly comprises a lead frame of electrically conductive material for providing interconnection to the integrated circuit die. The lead frame having a first predetermined pattern of outer leads, a second predetermined pattern of inner leads connected to the first predetermined pattern of outer leads and an inner frame member at the ends of the inner leads for interconnecting a plurality of selected inner leads, such as leads for ground connections, for reducing the electrical resistances and inductances of the selected inner leads and for providing mechanical strength to the lead frame. When the selected inner leads are for ground connections, the integrated circuit package assembly affords substantially reduced ground bounce to allow for the proper functioning of the high performance hermetic integrated circuit. The inner frame member comprises a first annular rectangle of electrically conductive material defining a first cavity. The first annular rectangle peripherally extending in spaced relation around the ends of the inner leads. There is a frame interconnection member at the ends of the outer leads for interconnecting all the outer leads.

The integrated circuit package assembly further comprises a base of insulating material for supporting the lead frame. The base having a first bottom surface, a first top surface on the opposite side of the first bottom surface and a first layer of glass material on top of the first top surface for attaching the lead frame to the base. The glass material covering an area on the first top surface in the shape of a second annular rectangle. The second annular rectangle of glass material defining a second cavity having a dimension of roughly the size of the first cavity. The integrated circuit package assembly further includes a cap of insulating material for encapsulating the integrated circuit die, the first cavity, the second cavity, the inner frame member, the inner leads and a portion of the outer leads. The cap includes a second top surface, a second bottom surface on the opposite side of the second top surface, and a second layer of glass material on top of the second bottom surface for reacting with the glass material on the first top surface to form a hermetic seal. The glass material covering an area on the second bottom surface in the shape of a third annular rectangle which defines a third cavity with a dimension of roughly the size of the second cavity.

In accordance with another aspect of the invention, the lead frame of the integrated circuit package assembly further having a carrier ring disposed around the outer leads for supporting the outer leads and a plurality of spaced tie bar members extending integrally between the inner frame member and the frame interconnection member to allow for multi-stage trimming and forming of the outer leads.

BRIEF DESCRIPTION OF THE DRAWINGS

The accompanying drawing incorporated in and forming a part of the specification, illustrates several aspects of the present invention, and together with the description serve to explain the principles of the invention. In the drawings.

DESCRIPTION OF THE PREFERRED EMBODIMENT

The present invention relates to a high performance hermetic integrated circuit package assembly having a lead frame with inner frame member for reducing the electrical resistances and inductances of selected inner leads that are interconnected to the inner frame member. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Accordingly, the present invention is not intended to be limited to the embodiment shown but is to be accorded the widest scope consistent with the principles and features described herein.

Figure 1:
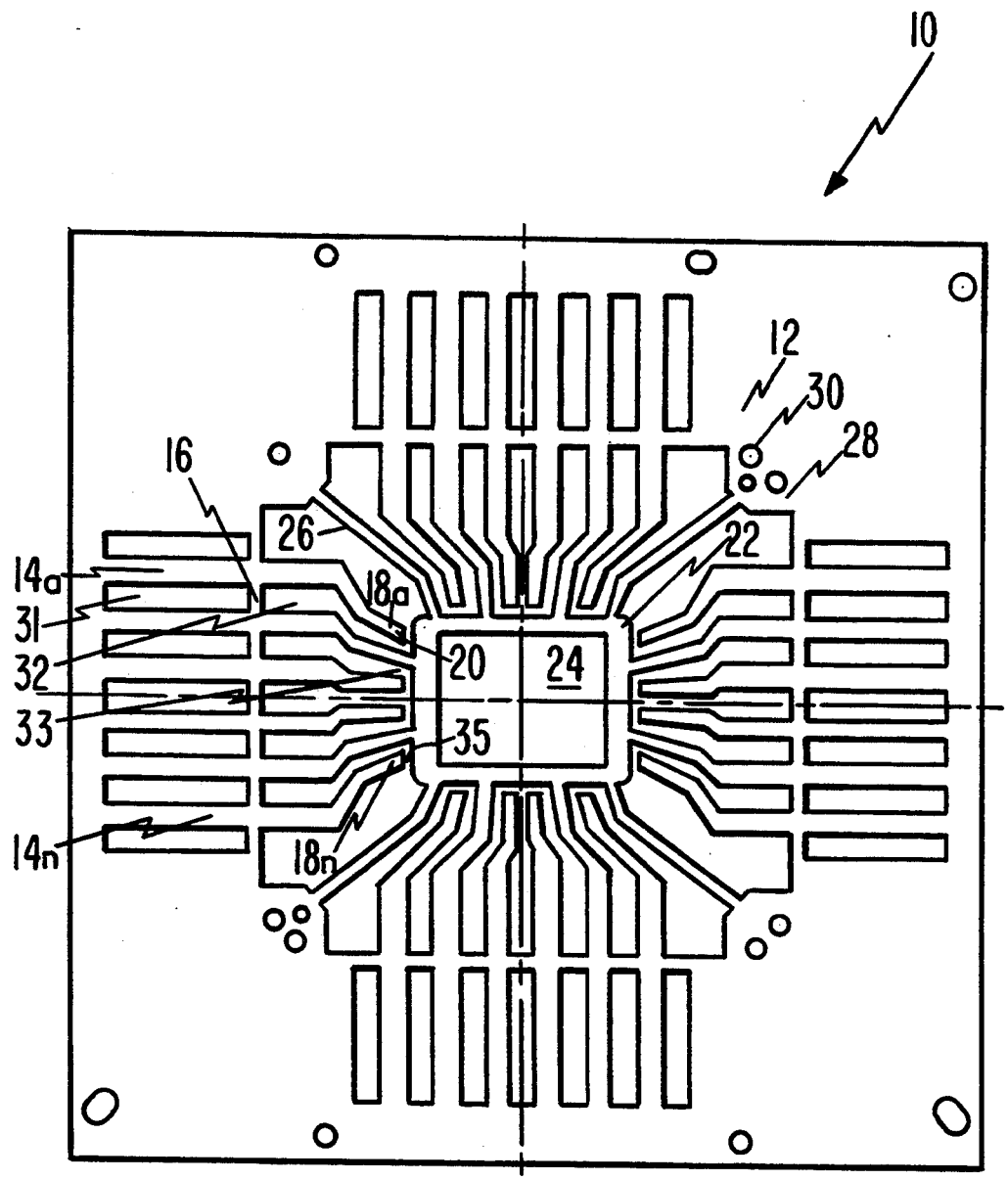
FIG. 1 is a top view of a lead frame with an inner frame member interconnecting a plurality of selected inner leads in accordance with the present invention.

Referring now to FIG. 1 of the drawings, there is shown a top view of a lead frame 10, constructed according to the present invention, for providing interconnection to an integrated circuit die (not shown) in an integrated circuit package assembly. Lead frame 10 is made of an electrically conductive material, such as Alloy 42 metal (42% Nickel and 56% Iron), and can be fabricated by stamping of a strip of metal using a stamping machine with a die-set or by etching, both of which are well known in the art. Lead frame 10 includes a frame interconnect means 12 supporting a first predetermined pattern of outer leads 14a, 14b, . . . 14n, where n represents the number of leads on each side of the lead frame. In the embodiment, the set of leads extend from four sides of a generally square lead frame. Lead frame dam bar 16 interconnects outer leads 14a, 14b, etc., and as later described, are eventually trimmed off to provide electrically discrete outer leads. Extending inwardly of outer leads 14a, 14b, etc., are a second predetermined pattern of inner leads 18a, 18b, . . . 18n, each of which have converging parallel inner terminus leads 20. Each inner lead 18a, 18b, etc., is integral with a corresponding one of the outer leads 14a, 14b, etc.

An inner frame member 22 is interconnecting the inner terminus leads 20 of a plurality of selected inner leads, such as the leads designated for connecting to the ground contact pads (not shown) on the integrated circuit die. In this embodiment, the selected inner leads are 18b, 18e, etc. Inner frame member 22 comprises an annular rectangle of the same material as the lead frame extending in space relation around the inner terminus leads 20 and defines a frame cavity 24. From an electrical stand point, interconnecting the selected inner leads 18b, 18e, etc., together is similar to connecting those leads in parallel and accordingly, the equivalent inductances and resistances of the selected inner leads 18b, 18e, etc., are significantly reduced. In addition, the inner frame member 22 acts as a partial electrically conductive plane which will further lower the electrical inductances and resistances of the selected inner leads 18b, 18e, etc.

If selected inner leads 18 are leads to be connected to the ground contact pads on the integrated circuit die, the resulting integrated circuit package assembly will have significantly reduced ground bounce and be able to maintain the ground bounce in the package assembly to within an acceptable limit, suitable for high performance hermetic integrated circuit die application, such as a microprocessor.

Attached to frame interconnect means 12 are four integrally spaced tie bar members 26 extending to and interconnecting inner frame member 22. Each tie bar member 26 interconnects to frame interconnect member 12 through a frame tab member 28. Each tab member 28 has at least one positioning hole 30 for the orientation of the lead frame and also, as will be explained later, for the positioning of the lead frame when the outer leads are trimmed and formed, Each outer lead 14a, 14b, etc. is separated by an open space 31 which is punched out or otherwise left open during the lead frame fabrication. Other open spaces 32, 33 and 35 are provided on the sides of the tie bars, the inner leads and around the inner frame member, respectively.

Figure 2:
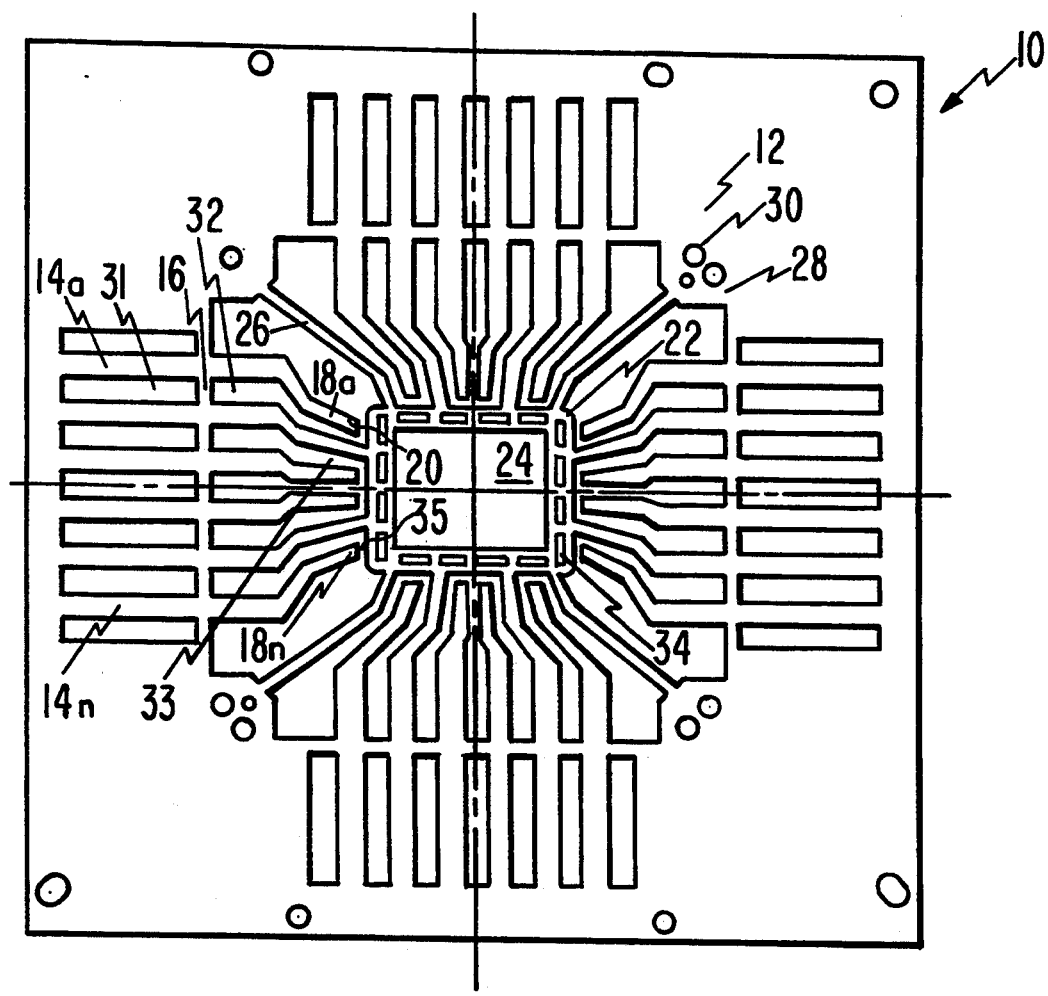
FIG. 2 is a top view of a lead frame with an inner frame member having a plurality of slots and interconnecting a plurality of selected inner leads in accordance with another embodiment of the present invention.

Referring now to FIG. 2 of the drawings, there is shown a top view of a lead frame 10, constructed according to the present invention, for providing interconnection to an integrated circuit die (not shown) in an integrated circuit package assembly. This embodiment is identical to the one in FIG. 1 above, except that the lead frame comprises an inner frame member having a plurality of slots 34. Slots 34 help to reduce stress built into the frame during the fabrication of the lead frame and results in better control of the coplanarity of the selected inner leads interconnecting to the inner frame member. Further, in case of a glass-sealed CERQUAD, as will be explained later, slots 34 also help the embedment of the inner frame member and the selected inner leads into the glass material, thus ensuring that the selected inner leads are sufficiently level, suitable for subsequent wire bonding operation.

Figure 3:
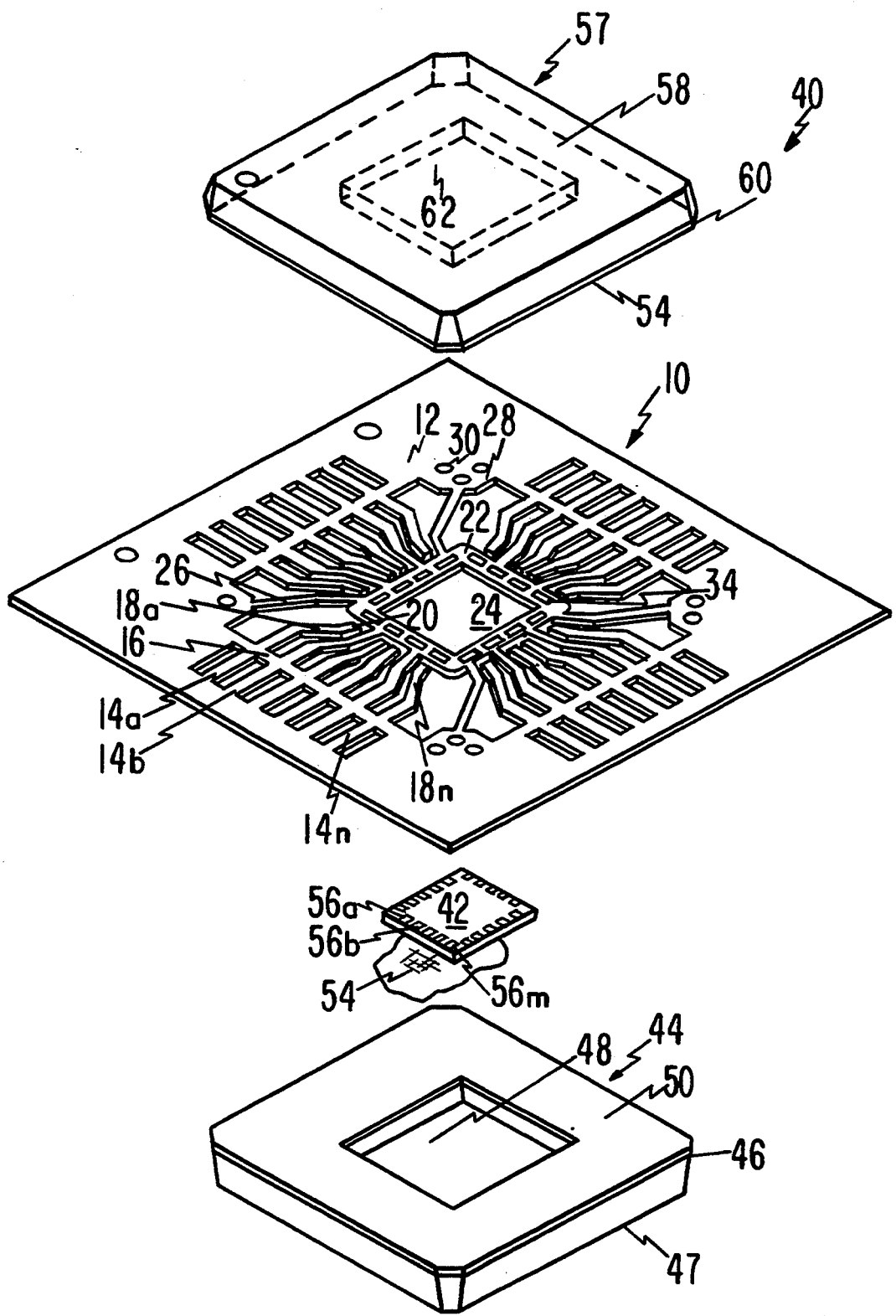
FIG. 3 is exploded view of a high performance hermetic integrated circuit package assembly for housing an integrated circuit die in accordance with the present invention, except that electrically conductive wires for connection between the die contact pads and the inner lead of the lead frame are omitted for clarity.

Turning to FIG. 3, there is shown a high performance hermetic integrated circuit package assembly 40, generally known as a glass-sealed CERQUAD, formed in accordance with the present invention. Package assembly 40 comprises lead frame similar to what was shown in FIG. 2 above.

Package assembly 40 further comprises a base 44 made of insulating material, such as pressed ceramic, for supporting lead frame 10. Base 44 includes a top surface 46 and a bottom surface 47. Top surface 46 is generally planar and typically includes a base cavity 48 in the center portion of the base in the form of an annular rectangle. Base cavity 48 having a dimension of roughly the size of frame cavity 24. A thin layer of glass material 50, such as a lead-zinc-borate glass, is coated, for example, by using screen printing techniques, on first top surface 46 in the shape of an annular rectangle generally matching the size and location of base cavity 48. Lead frame 10 is secured to base 44 by means of embedding Inner leads 18 and inner frame member 22 partially into glass material 50. By providing a plurality of slots 34 on inner frame member 22, the embedment of the inner frame member and the selected inner leads into the glass material is enhanced, thus ensuring that the selected inner leads are sufficiently level, suitable for subsequent wire bonding operation.

An integrated circuit die 42, which is generally rectangular, is centrally mounted on base cavity 48 by an adhesive layer 54, such as silver glass die attach material. Generally, die 42 comprises a plurality of contact pads 56a, 56b, ... 56m where m represents the number of contact pads on each side of the die. In this embodiment, the number of contact pads 56 on each side of die 42 is equal to the number of inner leads 18 on each side of lead frame 10. Typically, each contact pad is connected to a corresponding inner lead by a contact means, such as an electrically conductive wire using wire bonding techniques or an electrically conductive tape using tape automated bonding techniques. The contact means are omitted here for clarity. In today's high performance hermetic integrated circuit die, there are situations where one contact pad on the die accommodates more than one contact means or one contact pad being connected to more than one inner lead. These situations are common for contact pads that are reserved for ground or power supply voltage.

Package assembly 40 also includes a cap 57 made of insulating material, such as pressed ceramic. Cap 57 comprises a top surface 58 and a bottom surface 60. Bottom surface 60 is generally planar and typically includes a cap cavity 62 in the center portion of the cap in the form of an annular rectangle. cap cavity 62 having a dimension of roughly the size of base cavity 48. A thin layer of glass material 64, such as a lead-zinc-borate glass, is coated on bottom surface 60 in the shape of an annular rectangle generally matching the size and location of cap cavity 62. Generally, glass material 50 and 64 are of the same type. However, it is possible to use different type of glass material. Glass material 50 and 64 melt when subjected to a temperature of around 420 degrees C. and form a hermetic seal after having been cooled off, providing a hermetic enclosure and therefore protecting die 42 against moistures and contaminants from the environment.

Figure 4:
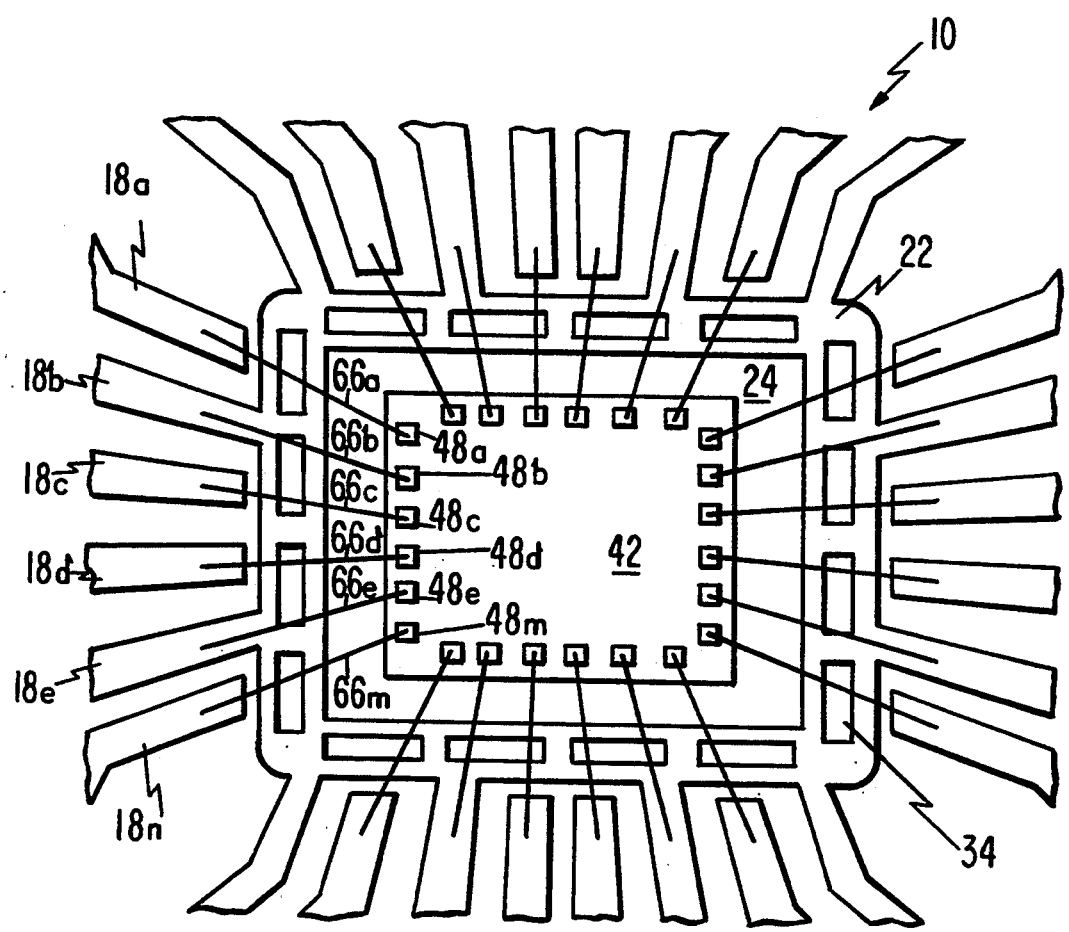
FIG. 4 is a top view another embodiment of the present invention showing a lead frame with inner frame member interconnecting a plurality of selected inner leads, and an integrated circuit die with electrically conductive wires interconnecting the die contact pads with the corresponding inner leads of the lead frame.

Referring now to FIG. 4, integrated circuit die 42 is shown with contact pads 48 interconnected to the corresponding inner leads 18 on lead frame 10 by wire bonds 66. Glass material 50 and base 44 are omitted for clarity. In this embodiment, contact pads 48b, 48e, etc., are intended for ground voltage and are wire bonded to the corresponding inner leads 18b, 18e, etc., which in turn are interconnected to inner frame member 22. As explained earlier, inner frame member 22 reduces the electrical inductances and resistances of inner leads 18b, 18e, etc., by interconnecting them in parallel and also acting as a partial electrically conductive plane. Accordingly, the ground bounce of the package assembly can be maintained to below the acceptable limit, of, for example, 1 volt.

Figure 5:
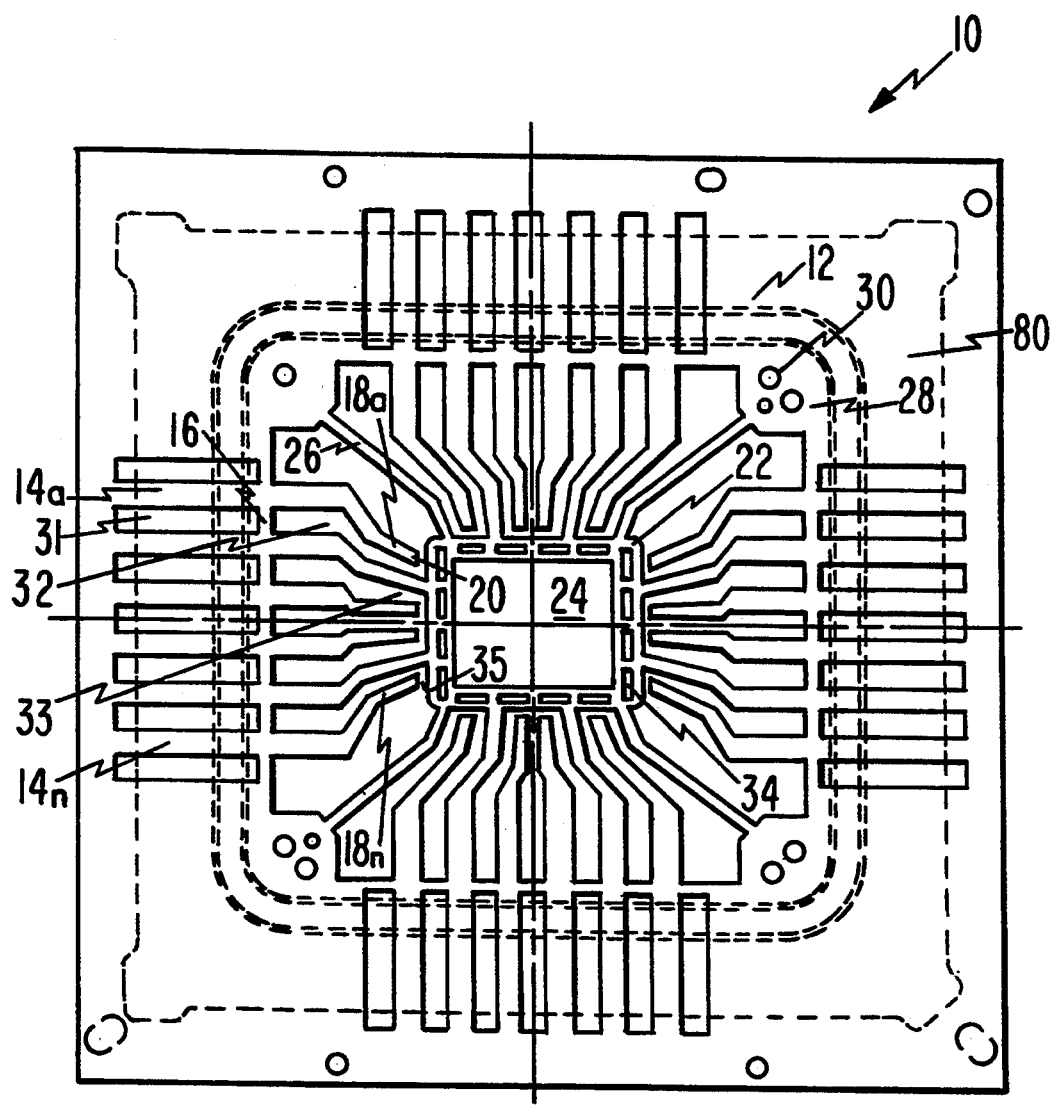
FIG. 5 is a top view of the lead frame shown in FIG. 2 with the outline of a carrier ring bonded thereto shown in dotted lines to permit view of the lead frame thereunder.

Referring now to FIG. 5, a lead frame made in accordance with the present invention is shown with a carrier ring 80 bonded thereto, forming a "TapePak" structure. Die 42, base 44 and cap 57 are omitted for clarity. FIG. 5 shows the relative location of carrier ring 80 with respect to lead frame 10.

Figure 6A:
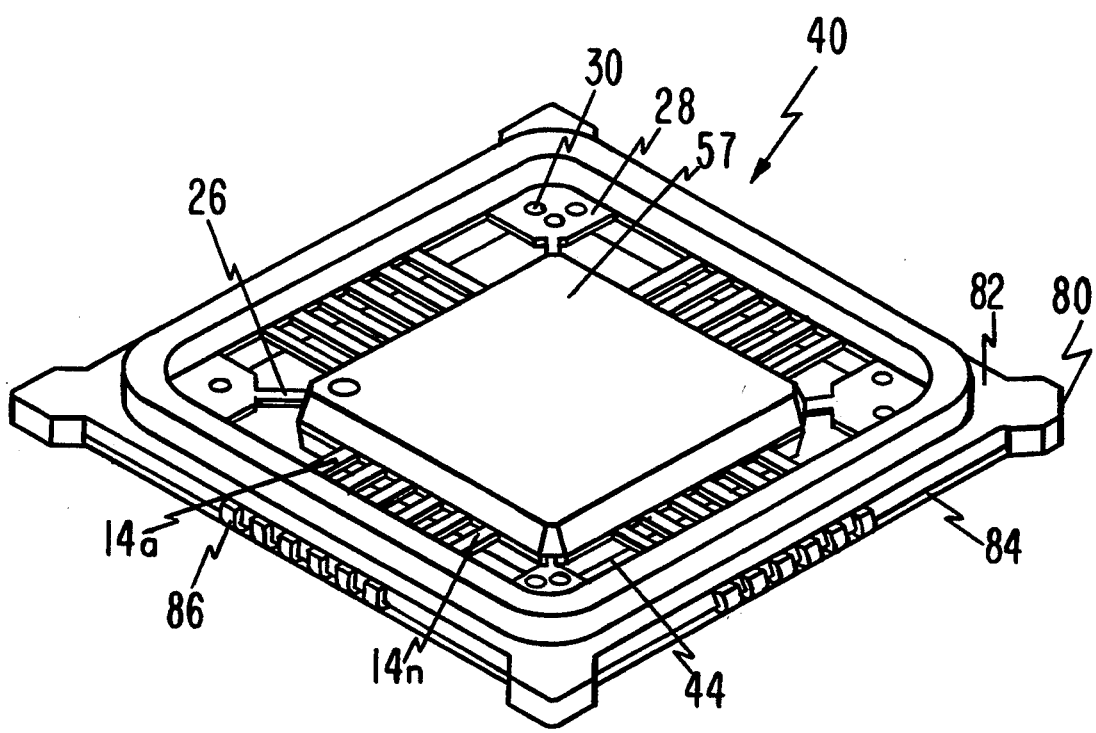
FIG. 6A is a perspective view of a high performance hermetic integrated circuit package assembly with a plurality of spaced tie bar members and a carrier ring disposed around the outer leads in accordance with the present invention.
Figure 6B:
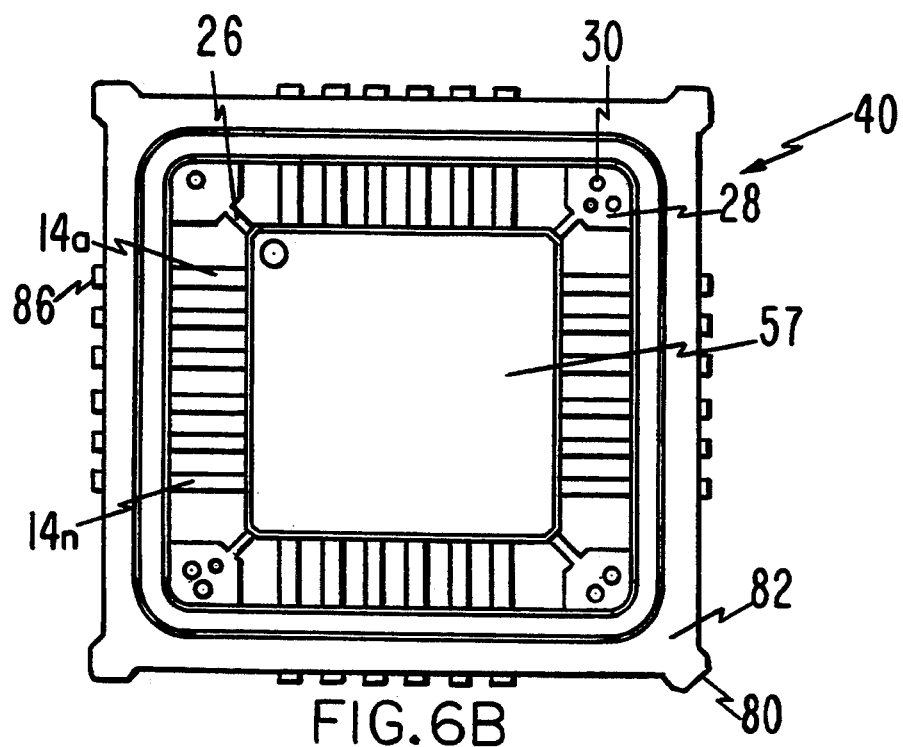
FIG. 6B is a top view of the high performance hermetic integrated circuit package assembly shown in FIG. 6A.
Figure 6C:
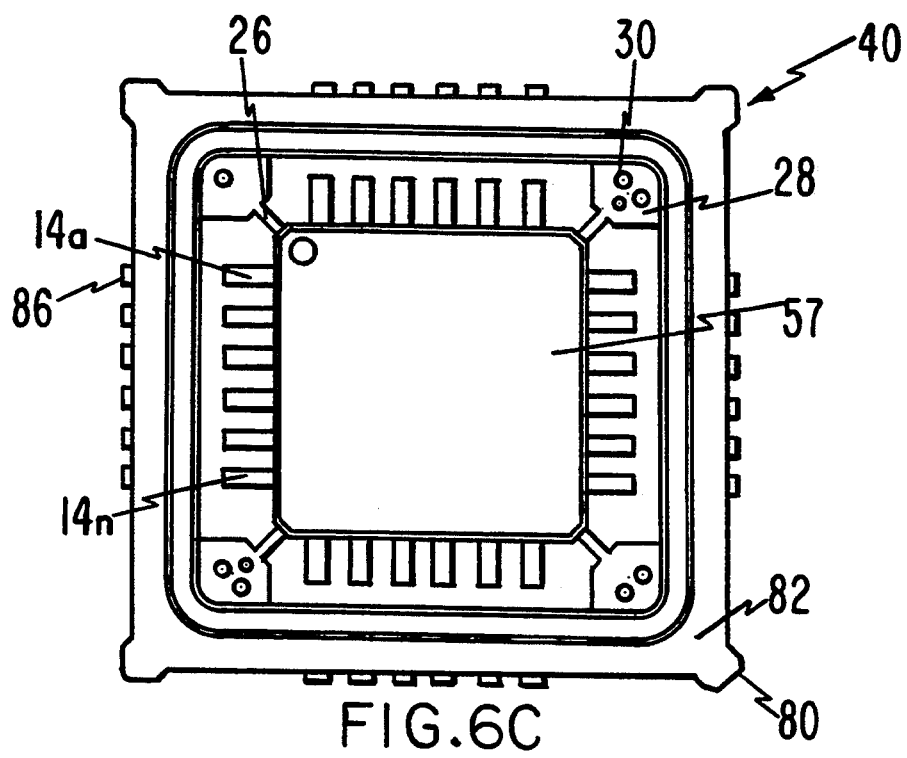
FIG. 6C is a top view of the high performance hermetic integrated circuit package assembly shown in FIG. 6A, except that the leads have been trimmed from the carrier ring.

Turning now to FIG. 6A, 6B and 6C, what is shown is a high performance hermetic integrated circuit package assembly 40, such as a glass-sealed CERQUAD with a carrier ring 80 bonded thereto. A more detailed explanation of the application of tie bar members 26 made according to the present invention will now be provided.

Carrier ring 80 serves to protect the outer leads from damage during subsequent testing operation and shipping. Carrier ring 80 can be formed on package assembly 40, after base 44 and cap 57 are hermetically sealed together, by means of transfer molding of an epoxy resin. Alternatively, as disclosed in U.S. Pat. No. 5,132,773 to Braden et al., a two-piece premolded carrier ring may be used to bond to a lead frame. Generally, carrier ring 80 have an upper portion 82 and a lower portion 84, sandwiching outer leads 14.

In FIG. 6A, package assembly is shown, with dam bar 16 and the outer portion of frame interconnection member 12 removed. Also, the outer portion of outer leads 14 have been removed and the remaining tip portions 86 are formed upwardly to act as contact points to allow for electrical testing of package assembly 40. Package assembly 40 are typically shipped to end users with carrier ring 80 thereon.

FIG. 6B is a top view of package assembly 40 with carrier ring 80 as shown in FIG. 6A. Carrier ring 80 is shown to be bonded to the inner portion of frame interconnection member 12, outer leads 14 and frame tab members 28.

When the end user is ready to use package assembly 40, for example, on a PCB, he would have to trim outer leads 14 from carrier ring 80 and also to form the outer leads, normally in a gull-wing style, to facilitate the soldering of the outer leads onto the PCB. It is generally known in the art, such as in the application of PQFP, that it is preferable to have multi-stage trimming and forming, i.e., the trimming and forming operation are done sequentially, rather than simultaneously. Multi-stage forming enables a better control in the forming process and is known to produce a much more accurate and repeatable forming. Therefore, even though a trimming and forming of outer leads 14 are typically done on a single machine, a separate trimming and a separate forming stage are provided for on the machine. Furthermore, in order to do an accurate forming, some form of positioning holes on the lead frame must be used to provide for positioning of the package assembly on the forming stage.

FIG. 6C shows the package assembly 40 immediately after outer leads 14 are trimmed from carrier ring 80. Package assembly 40 remains secured to carrier ring 80 by tie bar members 26 and frame tab members 28. Accordingly, by providing an inner frame member and connecting it to tie bar members 26 in accordance with the present invention, it is possible to do a subsequent forming of outer leads 14 using positioning holes 30 as reference for positioning of package assembly 40 on the forming stage. Not only does it result in a more accurate forming process, it also allows a glass-sealed CERQUAD to use the same trimming and forming equipment designed for PQFP, meaning a substantial saving in capital investment in extra equipment and factory space.

In contrast, a package assembly without an inner frame member would not be able to remain secured to carrier ring 80 after outer leads 14 are trimmed from the carrier ring. Thereafter, the package assembly becomes detached from carrier ring 80 and accordingly, no lead frame positioning holes will be available for positioning of the package assembly in subsequent forming operation. Thus, a multi-stage trimming and forming operation cannot be performed.

Figure 7:
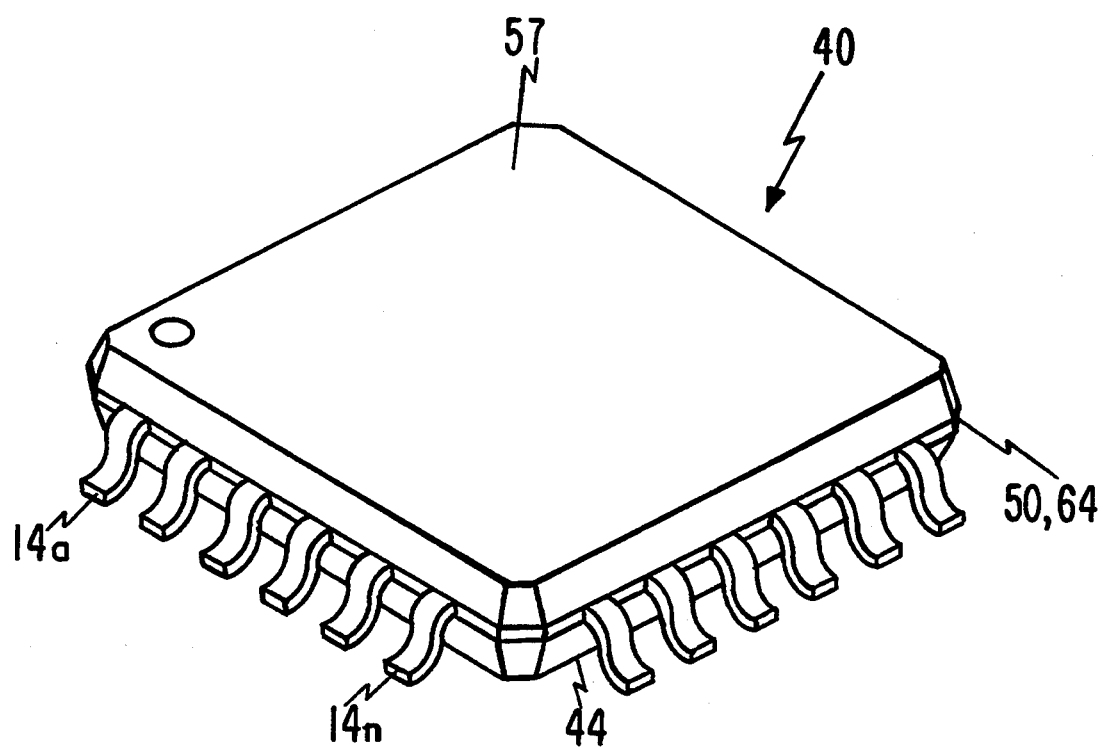
FIG. 7 is a perspective view of a high performance hermetic integrated circuit package assembly after trimming and forming of the outer leads.

Referring now to FIG. 7, there is shown a high performance hermetic integrated circuit package assembly, such as a glass-sealed CERQUAD, after trimming and forming of the outer leads into a gull-wing shape. The package assembly is ready for mounting on a PCB.

Accordingly, a lead frame used in a high performance hermetic integrated circuit package assembly is provided that reduces electrical inductances and resistances on preselected leads. Furthermore, the high performance hermetic integrated circuit package assembly comprises a lead frame having an inner frame member that interconnects ground leads, for reducing the electrical inductances and resistances of the ground leads, so as to maintain the ground bounce in the package to below the acceptable limit. The invention further discloses tie bar members interconnecting the inner frame member, to allow for multi-stage trimming and forming of outer leads when a carrier ring is used with the package assembly.

Although the present invention has been described in accordance embodiments shown in the figures, one of ordinary skill in the art recognizes there could be variations to the embodiments and those variations would be within the spirit and scope of the present invention. Accordingly, many modifications may be made by one of ordinary skill in the art without departing from the spirit and scope of present invention, the scope of which is defined solely by the appended claims.

What is claimed is:

1. A lead frame of electrically conductive material for providing interconnection to an integrated circuit die in an integrated circuit package assembly comprising:
   a first predetermined pattern of outer leads;
   a second predetermined pattern of inner leads integrally connected to the first predetermined pattern of outer leads; and
   an inner frame member for interconnecting a plurality of inner leads selected from the second predetermined pattern of inner leads, the inner frame member comprising an electrically conductive material defining a cavity within which the integrated circuit die is located, the material peripherally extending in spaced relation around the ends of the inner leads and the inner frame member.

2. The lead frame as recited in claim 1, wherein the electrically conductive material is of an annular rectangular shape.

3. The lead frame as recited in claim 1, wherein the inner frame member includes slots to relieve stress built into the lead frame during the fabrication of the lead frame.

4. The lead frame as recited in claim 1, wherein the selected inner leads are ground leads.

5. The lead frame as recited in claim 1, wherein the selected inner leads are power leads.

6. The lead frame as recited in claim 1, further comprises:
   a frame interconnection member for interconnecting the outer leads,
   a carrier ring disposed around the outer leads for providing mechanical stability and testability; and
   a plurality of spaced tie bar members extending integrally between the inner frame member and the frame interconnection member to allow for multi-stage trimming and forming of the outer leads.

7. A high performance hermetic integrated circuit package assembly for housing an integrated circuit die comprising:
   a lead frame of electrically conductive material for providing interconnection to the integrated circuit die, the lead frame having
   a first predetermined pattern of outer leads,
   a second predetermined pattern of inner leads integrally connected to the first predetermined pattern of outer leads, each of the inner lead terminating to an end away from the integrally connected outer lead, and
   an inner frame member at the ends of the inner leads for interconnecting a plurality of inner leads selected from the second predetermined pattern of inner leads for reducing the electrical inductances and resistances of the selected inner leads and for providing mechanical strength to the lead frame, the inner frame member comprises a first annular rectangle of electrically conductive material defining a first cavity, the first annular rectangle peripherally extending in spaced relation around the ends of the inner leads;
   a base of insulating material for supporting the lead frame, the base having
   a first bottom surface,
   a first top surface on the opposite side of the first bottom surface, and
   a first layer of glass material on top of the first top surface for attaching the lead frame to the base, the glass material covering an area on the first top surface in the shape of a second annular rectangle, the second annular rectangle of glass material defining a second cavity; and
   a cap of insulating material for encapsulating the integrated circuit die, the first cavity, the second cavity, the inner frame member, the inner leads and a portion of the outer leads, the cap having
   a second top surface,
   a second bottom surface on the opposite side of the second top surface, and
   a second layer of glass material on top of the second bottom surface for reacting with the glass material on the first top surface to form a hermetic seal, the glass material covering an area on the second bottom surface in the shape of a third annular rectangle, the third annular rectangle of glass material defining a third cavity.

8. The high performance hermetic integrated circuit package assembly as recited in claim 7, wherein the lead frame further comprises:
   a frame interconnection member for interconnecting the outer leads;
   a carrier ring disposed around the outer leads for providing mechanical stability and testability; and
   a plurality of spaced tie bar members extending integrally between the inner frame member and the frame interconnection member to allow for multi-stage trimming and forming of the outer leads.

9. The high performance hermetic integrated circuit package assembly as recited in claim 7, wherein the inner frame member includes a plurality of slots to relieve stress built into the frame during the fabrication of the lead frame and to improve the embedment of the inner frame member and the selected inner leads into the first layer of glass material.

10. The high performance hermetic integrated circuit package assembly as recited in claim 7, wherein the selected inner leads are ground leads.

11. The high performance hermetic integrated circuit package assembly as recited in claim 7, wherein the selected inner leads are power leads.

12. The high performance hermetic integrated circuit package assembly as recited in claim 7, further comprises:
   an integrated circuit die having a plurality of contact pads on an exterior surface, the die being mounted on the second cavity of the base; and
   a series of contact means connecting selected ones of the contact pads to the selected ones of the inner leads.

13. The high performance hermetic integrated circuit package assembly as recited in claim 12, wherein the contact means are electrically conductive wires.

14. The high performance hermetic integrated circuit package assembly as recited in claim 12, wherein the contact means are electrically conductive tapes.

15. A high performance hermetic integrated circuit package assembly comprising:
   a lead frame of electrically conductive material having
   a first predetermined pattern of outer leads,
   a second predetermined pattern of inner leads integrally connected to the first predetermined pattern of outer leads, each of the inner lead terminating to an end away from the integrally connected outer lead, and
   an inner frame member at the ends of the inner leads for interconnecting all inner leads for ground leads for reducing the electrical inductances and resistances of the ground leads and for providing mechanical strength to the lead frame, the inner frame member comprises a first annular rectangle of electrically conductive material defining a first cavity, the first annular rectangle peripherally extending in spaced relation around the ends of the inner leads;
   a base of insulating material for supporting the lead frame, the base having
   a first bottom surface,
   a first top surface on the opposite side of the first bottom surface, and
   a first layer of glass material on top of the first top surface for attaching the lead frame to the base, the glass material covering an area on the first top surface in the shape of a second annular rectangle, the second annular rectangle of glass material defining a second cavity;
   an integrated circuit die having a plurality of contact pads on an exterior surface, the die being mounted on the second cavity of the base;
   a series of electrically conductive wires connecting selected ones of the contact pads to the selected ones of the inner leads; and
   a cap of insulating material for encapsulating the integrated circuit die, the first cavity, the second cavity, the inner frame member, the inner leads and a portion of the outer leads, the cap having
   a second top surface,
   a second bottom surface on the opposite side of the second top surface, and
   a second layer of glass material on top of the second bottom surface for reacting with the glass material on the first top surface to form a hermetic seal, the glass material covering an area on the second bottom surface in the shape of a third annular rectangle, the third annular rectangle of glass material defining a third cavity.

16. The high performance hermetic integrated circuit package assembly as recited in claim 15, further comprises a frame interconnection member for interconnecting the outer leads;

a carrier ring disposed around the outer leads for providing mechanical stability and testability; and a plurality of spaced tie bar members extending integrally between the inner frame member and the frame interconnection member to allow for multistage trimming and forming of the outer leads.

17. The high performance hermetic integrated circuit package assembly as recited in claim 15, wherein the inner frame member includes slots to relieve stress built into the frame during the fabrication of the lead frame and improve the embedment of the inner frame member and the selected inner leads into the first layer of glass material.

* * * * *